(12) United States Patent
Abenthung et al.

(10) Patent No.: US 8,900,340 B2
(45) Date of Patent: *Dec. 2, 2014

(54) TUBULAR TARGET AND PRODUCTION METHOD

(75) Inventors: Peter Abenthung, Reutte (AT); Karl Huber, Reutte (AT); Harald Lackner, Reutte (AT); Gerhard Leichtfried, Reutte (AT); Peter Polcik, Reutte (AT); Christian Weratschnig, Reutte (AT)

(73) Assignee: Plansee SE, Reutte (AT)

( * ) Notice: Subject to any disclaimer, the term of this patent is extended or adjusted under 35 U.S.C. 154(b) by 98 days.

This patent is subject to a terminal disclaimer.

(21) Appl. No.: 13/310,147

(22) Filed: Dec. 2, 2011

(65) Prior Publication Data

US 2012/0073959 A1 Mar. 29, 2012

Related U.S. Application Data

(60) Division of application No. 11/581,698, filed on Oct. 16, 2006, which is a continuation of application No. PCT/AT2006/000406, filed on Oct. 5, 2006.

(30) Foreign Application Priority Data

Oct. 14, 2005 (AT) .............................. GM699/2005 U

(51) Int. Cl.
*B22F 9/00* (2006.01)
*C22C 5/00* (2006.01)

(52) U.S. Cl.
USPC ............................................ 75/245; 148/423

(58) Field of Classification Search
USPC ........................ 204/298.12; 75/245; 148/423
IPC .................................. B22F 5/106; C22C 1/045
See application file for complete search history.

(56) References Cited

U.S. PATENT DOCUMENTS

| | | | |
|---|---|---|---|
| 2,985,956 A | 5/1961 | Appel | |
| 4,089,681 A | 5/1978 | Gueussier | |
| 4,356,073 A | 10/1982 | McKelvey | |
| 4,422,916 A | 12/1983 | McKelvey | |
| 4,899,570 A | * 2/1990 | Mills et al. | 72/364 |
| 5,263,349 A | 11/1993 | Felix et al. | |
| 5,435,965 A | 7/1995 | Mashima et al. | |
| 5,540,882 A | 7/1996 | Billgren | |
| 5,641,580 A | 6/1997 | Sampath et al. | |
| 5,693,203 A | * 12/1997 | Ohhashi et al. | 204/298.12 |
| 5,798,008 A | 8/1998 | Nogami et al. | |
| 5,913,100 A | 6/1999 | Kohsaka et al. | |
| 6,080,341 A | 6/2000 | Stenger et al. | |
| 6,193,856 B1 | 2/2001 | Kida et al. | |
| 6,200,694 B1 | 3/2001 | Kohsaka et al. | |
| 6,521,173 B2 | 2/2003 | Kumar et al. | |
| 6,787,011 B2 | 9/2004 | Ueda et al. | |
| 6,793,784 B1 | 9/2004 | Bach et al. | |
| 6,878,250 B1 | 4/2005 | Segal et al. | |
| 6,946,039 B1 | 9/2005 | Segal et al. | |
| 7,153,589 B1 | 12/2006 | Kohsaka et al. | |
| 7,468,110 B2 | 12/2008 | Ford et al. | |
| 7,534,282 B2 | 5/2009 | Ibaraki et al. | |
| 8,088,232 B2 | 1/2012 | Lemon et al. | |
| 2002/0041819 A1 | 4/2002 | Kumar et al. | |
| 2005/0061106 A1 | 3/2005 | Ibaraki et al. | |
| 2005/0189401 A1 | 9/2005 | Butzer et al. | |
| 2005/0191202 A1 | 9/2005 | Iwasaki et al. | |
| 2006/0042728 A1 | 3/2006 | Lemon et al. | |
| 2006/0151321 A1 | 7/2006 | Itoh et al. | |
| 2007/0007131 A1 * | 1/2007 | Smathers et al. | 204/298.12 |
| 2008/0193798 A1 * | 8/2008 | Lemon et al. | 428/698 |
| 2012/0073959 A1 | 3/2012 | Abenthung et al. | |

FOREIGN PATENT DOCUMENTS

| | | |
|---|---|---|
| AT | 007491 U1 | 4/2005 |
| DE | 19822570 C1 | 7/1999 |
| DE | 19953470 A1 | 5/2001 |
| DE | 10043748 A1 | 3/2002 |
| DE | 20205363 U1 | 7/2002 |
| EP | 0006056 A1 | 12/1979 |
| EP | 0500031 A1 | 8/1992 |
| EP | 0735152 B1 | 4/2002 |
| GB | 601057 A | 4/1948 |
| GB | 704737 A | 2/1954 |
| JP | 54050290 A | 4/1979 |
| JP | 55062164 A | 5/1980 |
| JP | 61163201 A | 7/1986 |
| JP | 3150356 A | 6/1991 |
| JP | H08501498 A | 2/1996 |
| JP | 10183341 A | 7/1998 |
| JP | 2000001732 A | 1/2000 |
| JP | 2000045066 A | 2/2000 |
| JP | 2005133198 A | 5/2005 |
| JP | 2005281862 A | 10/2005 |
| JP | 2008511757 A | 4/2008 |

(Continued)

OTHER PUBLICATIONS

Bryhan, A. J., "Joining of Molybdenum Base Metals and Factors which Influence Ductility", Welding Research Bulletin, UB/TIB Hannover, Feb. 1986.
Leichtfried et al., "Refractory Metals and Alloys", Springer Handbook of Condensed Matter and Material Data, Chapter 1.9, p. 314, 2005.
Kumar et al., "Grain Boundary Segregation and Intergrannular Fracture in Molybdenum", pp. 431-459, vol. 370, Apr. 24, 1980.
English translation of: "Transition of DBTT".

(Continued)

*Primary Examiner* — Weiping Zhu
(74) *Attorney, Agent, or Firm* — Laurence A. Greenberg; Werner H. Stemer; Ralph E. Locher

(57) ABSTRACT

A tubular target is formed of molybdenum or a molybdenum alloy which has an oxygen content of less than 50 µg/g, a density of greater than 99% of the theoretical density and an average grain size of less than 100 µm. The molybdenum or molybdenum alloy tube may be produced by extrusion and it is formed with walls having a wall thickness that increases towards the ends of the tube. The molybdenum tube has a backing tube of titanium or titanium alloy that is attached inside with a material bond connection. Alternatively, the backing tube is formed of austenitic steel or a copper alloy.

13 Claims, No Drawings

(56) References Cited

FOREIGN PATENT DOCUMENTS

| RU | 2015850 C1 | 7/1994 |
|---|---|---|
| RU | 2100145 C1 | 12/1997 |
| TW | 555874 B | 10/2003 |
| TW | 573032 B | 1/2004 |
| TW | 201333241 A | 8/2013 |
| WO | 9406949 A1 | 3/1994 |
| WO | 2006026621 A2 | 3/2006 |

OTHER PUBLICATIONS

Brown et al., "An Internal Variable Constitutive Model for Hot Working of Metals", International Journal of Plasticity, vol. 5, pp. 95-130, 1989.

Schatt et al., "Pulvermetallurgie—Technologien und Werkstoffe", VDI-Verlag GmbH, Düsseldorf, 1994, ISBN 3-18-401343-X—English translation of relevant parts.

* cited by examiner

TUBULAR TARGET AND PRODUCTION METHOD

CROSS-REFERENCE TO RELATED APPLICATION

This application is a divisional of copending application Ser. No. 11/581,698, filed Oct. 16, 2006; which was a continuation, under 35 U.S.C. §120, of international application No. PCT/AT2006/000406, filed Oct. 5, 2006; which claimed the priority, under 35 U.S.C. §119, of Austrian application AT GM 699/2005, filed Oct. 14, 2005; the prior applications are herewith incorporated by reference in their entirety.

BACKGROUND OF THE INVENTION

Field of the Invention

The invention relates to a method for producing a tubular target, which comprises a tube of molybdenum or a molybdenum alloy with an oxygen content of less than 50 µg/g, a density of greater than 99% of the theoretical density, and an average grain size transversely to the axial direction of less than 100 µm as well as a supporting tube of a non-magnetic material.

A target is understood as meaning the material to be sputtered of a cathode atomization system. Rotating tubular targets are known and described for example in U.S. Pat. Nos. 4,422,916 and 4,356,073. During the sputtering, the tubular target rotates about a magnetron located in the tube. Tubular targets are predominantly used for producing coatings over large surface areas. The rotation of the tubular target achieves the effect of uniform erosion of the sputtering material. Tubular targets therefore have a high utilization rate of the target material and a long target lifetime, which is of significance in particular in the case of expensive coating materials, as is the case with molybdenum. The utilization rate for planar targets is around 15 to 40% and for tubular targets around 75 to 90%.

The target cooling performed in the space inside the tubular target is much more effective than in the case of planar targets as a result of the more favorable heat transfer in the tube, which makes a higher coating rate possible. In order to ensure that no cooling water flows out even with high target utilization, and also to increase the mechanical load-bearing capacity and facilitate fixing in the sputtering system, the tubular target is usually connected to a supporting tube or backing tube. The supporting tube must in this case be of a non-magnetic material, in order not to interact with the magnetic field which determines the erosion region.

As mentioned, the use of tubular targets is advantageous whenever substrates of a large area are to be coated. In the case of molybdenum as the target material, this is the case for example in LCD-TFT production and glass coating.

A multitude of production methods are described for the production of tubular targets. Many of those methods take a liquid phase route, such as for example continuous and centrifugal casting. The latter is described in German published patent application DE 199 53 470 and its counterpart U.S. Pat. No. 6,793,784 B1. On account of the higher melting point of molybdenum and the resultant problems with finding a suitable mold material, these ways of carrying out production cannot be used for molybdenum and its alloys.

Tubular targets may also be produced by winding a thick strip around a core and welding the contact regions. However, the weld seam has a much more coarse microstructure and pores, which leads to non-uniform erosion and, as a consequence, different layer thicknesses. Moreover, in the case of molybdenum, the welded region is extremely brittle and consequently at risk of cracking.

A further tubular target is known from U.S. Pat. No. 4,356,073. Production takes place in this case by the sputtering material being deposited on a backing tube by plasma spraying. Even using the vacuum plasma spraying technique, however, completely dense tubular targets cannot be produced with an adequately low gas content. Electrochemical deposition, as is used for Cr and Sn, is also not suitable for molybdenum and its alloys.

U.S. Pat. No. 5,435,965 and European patent publication EP 0 500 031 A1 describe the production of a tubular target by hot-isostatic pressing. There, a backing tube is positioned in a can, so as to produce between the backing tube and the mold an intermediate space into which powder of the target material is filled. After closing the can, it is subjected to a hot-isostatic densification operation. The amount of powder used in relation to the weight of the finished tubular target is in this case unfavorably high.

U.S. Pat. Nos. 6,878,250 B2 and 6,946,039 B2 describe the use of ECAP (equal channel angular pressing) for the production of sputtering targets. In the case of molybdenum alloys with comparatively high $k_f$ values, this leads to a high level of tool wear.

SUMMARY OF THE INVENTION

It is accordingly an object of the invention to provide a method of producing a sputtering target which overcomes the above-mentioned disadvantages of the heretofore-known devices and methods of this general type and which on the one hand is inexpensive and on the other hand produces a product which is uniformly eroded in the sputtering process, does not tend to give a locally increased sputtering rate and does not lead to any contamination of the substrate or the deposited layer.

With the foregoing and other objects in view there is provided, in accordance with the invention, a tubular target, comprising:
a molybdenum tube formed of a metal powder of Mo or Mo alloy, the molybdenum tube having:
an oxygen content less than 50 µg/g;
a density greater than 99% of a theoretical density;
an average grain size transversely to an axial direction of the tube of less than 100 µm; and
the molybdenum tube having ends and a wall thickness increasing towards the ends of said tube.

In a preferred embodiment, there is provided a supporting tube of titanium or a titanium alloy inside the molybdenum tube and connected to the molybdenum tube by a material bond.

With the foregoing and other objects in view there is also provided, in accordance with the invention, a method of producing a tubular target, the method which comprises the following steps:
providing a metal powder of Mo or an Mo alloy with an average particle size according to Fisher of from 0.5 to 10 µm;
cold-isostatic pressing the metal powder in a flexible mold using a core at a pressure p, where 100 MPa<p<500 MPa, for producing a green compact in the form of a tube blank;
producing a tube blank by sintering the green compact at a temperature T, where 1600° C.<T<2500° C., in a reducing atmosphere or a vacuum;
producing a tube by heating the tube blank to a forming temperature T, where DBTT<T<($T_S$ minus 800° C.) and extruding over a mandrel;

joining the tube to a supporting tube of non-magnetic material and mechanically processing, to form a tubular target of a tube of molybdenum or a molybdenum alloy with an oxygen content of less than 50 μg/g, a density of greater than 99% of the theoretical density and an average grain size transversely to the axial direction of less than 100 μm, and the supporting tube.

With the above and other objects in view there is also provided, in accordance with the invention, a method of producing a tubular target which comprises the following method steps:

providing a metal powder of Mo or an Mo alloy with an average particle size according to Fisher of from 0.5 to 10 μm;

cold-isostatic pressing the metal powder in a flexible mold using a core at a pressure p, where 100 MPa<p<500 MPa, for producing a green compact in the form of a tube blank;

sintering the green compact at a temperature T, where 1600° C.<T<2500° C., in a reducing atmosphere or a vacuum for producing a tube blank;

working the tube blank and joining at least one steel tube end piece for fixing a supporting tube of austenitic steel blank inside the tube blank;

producing a composite tube by heating to a forming temperature T, where 900<T<1350° C. and co-extruding over a mandrel; and machining the composite tube for forming a tubular target with a tube of molybdenum or a molybdenum alloy with an oxygen content of less than 50 μg/g, a density of greater than 99% of theoretical density, and an average grain size transversely to an axial direction of less than 100 μm, and the supporting tube.

In order to achieve an adequate fine grained structure, sintering activity, and consequently density, a metal powder with a particle size according to Fisher of 0.5 to 10 μm is used. For the production of pure Mo tubular targets, Mo powder with a metal purity of greater than 99.9% by weight is advantageously used. If a tubular target is produced from an Mo alloy, either powder mixtures or prealloyed powders are used, the particle size however likewise lying in the range from 0.5 to 10 μm. The powder is filled into a flexible mold, in which the core is already positioned. The core determines the inner diameter of the tube blank, with allowance for the compaction during the pressing operation and the sintering shrinkage. Customary tool steels are suitable as the material for the core. After filling the flexible mold with the metal powder and liquid-tight closing of the flexible mold, it is positioned in a pressure vessel of a cold-isostatic press. The compaction takes place at pressures between 100 and 500 MPa. After that, the green compact is taken out of the flexible mold and the core is removed. Following that, the green compact is sintered at a temperature in the range from 1600° C. to 2500° C. in a reducing atmosphere or a vacuum. Below 1600° C., adequate densification is not achieved. Above 2500° C., undesired grain coarsening begins. The sintering temperature to be chosen depends on the particle size of the powder. Green compacts produced from a powder with a particle size of 0.5 μm according to Fisher can be sintered at a sintering temperature of as low as 1600° C. to a density of greater than 95% of the theoretical density, whereas for green compacts which are produced from a powder with a particle size of 10 μm according to Fisher a sintering temperature of approximately 2500° C. is required. If the dimensional accuracy of the pressing process is not adequate, which is usually the case, the sintered blank is machined. The outer diameter of the sintered blank is in this case determined by the inner diameter of the container of the extrusion press. To make it possible for the extruded blank to be positioned unproblematically in the container of the extrusion press, the outer diameter of the sintered blank is somewhat smaller than the inner diameter of the container. The inner diameter is in turn determined by the diameter of the mandrel.

In order to reduce the discharge loss of molybdenum during the extrusion, it is advantageous to mechanically fasten a steel end piece to one end of the molybdenum tube blank. This mechanical fastening may be performed for example by means of a screwed or bolted connection. The outer diameter and the inner diameter of the steel end piece of the tube blank in this case correspond to the outer diameter and the inner diameter of the molybdenum tube blank.

For the extrusion, the tube blank is heated to a temperature T, where DBTT<T<($T_S$–800° C.). DBTT is to be understood here as meaning the ductile brittle transition temperature. At lower temperatures, cracking increasingly occurs. The upper temperature element is given by the melting temperature ($T_S$) of the molybdenum alloy less 800° C. This ensures that no undesired grain coarsening takes place during the extruding operation. The initial heating may in this case be performed in a conventional gas or electrically heated furnace (for example a rotary hearth kiln), allowance having to be made that the gas flow control is chosen such that the lambda value is neutral or negative. In order to obtain higher extrusion temperatures, inductive reheating may be performed. After the initial heating operation, the tube blank is rolled in a glass powder mixture. After that, the tube blank is positioned in the container of the extrusion press and pressed over a mandrel through a die to the respective outer or inner diameter.

It is advantageous if the extruded tube is subjected to a recovering or recrystallizing annealing process in a reducing atmosphere or a vacuum at a temperature T of 700° C.<T<1600° C. If the temperature goes below the lower limit, the stress reduction is too little. At a temperature greater than 1600° C., grain coarsening occurs. The extruded tube is machined on the outer side of the tube, the end faces and advantageously the inner side of the tube.

The molybdenum tube produced in this way is connected to a supporting tube of a non-magnetic material. The outer diameter of the supporting tube corresponds approximately to the inner diameter of the molybdenum tube. Furthermore, the supporting tube reaches beyond the respective ends of the molybdenum tube. Copper alloys, austenitic steels, titanium or titanium alloys are to be mentioned as particularly suitable materials for the supporting tube.

Suitable as connecting methods are both those methods which lead to a material bond and those which lead to a form-fitting connection. One condition, however, is that the contact area between the molybdenum tube and the supporting tube be at least 30% of the theoretically possible area. If the area is smaller, the heat removal is hindered too much. Also the low coefficient of thermal expansion of molybdenum has to be considered. Therefore, the joining temperature must be chosen to be as low as possible. If, for example, the connection between the molybdenum tube and the supporting tube is performed by a forging process, in that the supporting tube is positioned in the molybdenum tube and forged over a mandrel, lowest possible forming temperatures of about 500° C. to 800° C. must be chosen. Furthermore, it is advantageous if the material of the supporting tube has a low yield strength, in order that stresses occurring due to plastic flow can be reduced.

In a further method according to the invention, the molybdenum tube blank is co-extruded with a blank of the supporting tube. The production of the molybdenum tube is in this case again based on a metal powder with an average particle size according to Fisher of 0.5-10 μm. The tube blank is once again produced by cold-isostatic pressing of the metal powder in a flexible mold using a core and sintering in the range from 1600° C. to 2500° C.

Following the sintering, the tube blank is machined. Inside the tube blank, a supporting tube blank of an austenitic steel is positioned. At one or both end pieces of the tube blank, a steel tube end piece is joined on by a mechanical connection (for example a screwed or bolted connection). The tube end piece has in this case approximately the inner diameter and outer diameter of the tube blank. The thickness of the tube end piece preferably lies in the range from 10 to 100 mm. Fastened in turn to the tube end piece is the supporting tube blank. This fastening preferably takes place by a welded connection.

The outer diameter of the supporting tube blank may correspond approximately to the inner diameter of the molybdenum tube blank or else be chosen such that a defined gap is produced between the molybdenum tube blank and the supporting tube blank. A steel powder, preferably of austenitic steel, is filled into this defined gap. The composite tube body produced in this way is heated to a forming temperature of from 900° C. to 1350° C. Only tubular targets of molybdenum alloys which can be appropriately deformed at this temperature can be produced in this way. A higher extrusion temperature cannot be chosen on account of the steel.

The composite tube blank produced in this way is extruded over a mandrel (co-extrusion), whereby a composite tube is produced. Optionally, this may be followed by carrying out an annealing process, the annealing temperature preferably lying around 800° C. to 1300° C.

Use of a gap with a steel powder fill lying in between has the effect of improving the bond between the supporting tube and the molybdenum tube during the co-extrusion. A gap width of from 3 mm to 20 mm proves to be advantageous.

The use of glass powder as a lubricant achieves the effect of an outstanding surface of the tubular target in the case of both extrusion and co-extrusion, whereby the machining can be reduced to a minimum. Furthermore, this ensures that the tubular target is free from pores and also free from grain boundary cracks. The range from 40 to 80% has been found to be an advantageous degree of forming during the extrusion process. The degree of forming is in this case determined as follows: ((initial cross section before extrusion less cross section after extrusion)/initial cross section)×100.

After the extrusion/co-extrusion process, it may be advantageous for the extruded tube to be straightened. This can be performed by a forging process over a mandrel.

Furthermore, the wall thickness over the length of the molybdenum tube or composite tube can also be varied by a subsequent forging process. The wall thickness can in this case be advantageously made thicker in the region of the tube ends. The region of the tube ends is also the region of greatest erosion during use.

The surface quality and the dimensional tolerances are set by appropriate machining.

It is ensured by the method according to the invention that the oxygen content in the molybdenum alloy is <50 µg/g, preferably less than 20 µg/g, the density is greater than 99% of the theoretical density, preferably greater than 99.8% of the theoretical density, and the average grain size transversely to the axial direction is less than 100 µm, preferably less than 50 µm. The average grain size is determined transversely to the axial direction because in the case of an deformed, non-recrystallized microstructure, the grains are stretched in the axial direction and consequently an exact determination of the grain size in the axial direction is made more difficult. With both methods described, it is possible to produce molybdenum tubular targets with a metallic purity of greater than 99.99% by weight. Metallic purity is to be understood in this case as meaning the purity of the molybdenum tubular target without gases (O, H, N) and C. Tungsten is also not considered in this value, which is uncritical for the application.

For the tubular target according to the invention to be used in the area of TFT-LCD production, molybdenum alloys which contain 0.5 to 30% by weight of V, Nb, Ta, Cr and/or W are also particularly suitable.

Other features which are considered as characteristic for the invention are set forth in the appended claims.

Although the invention is illustrated and described herein as embodied in tubular target, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments and the following specific example.

DESCRIPTION OF THE PREFERRED EMBODIMENTS

Example $MoO_3$ powder was reduced in a two-stage reduction process at 600 and 1000° C. to give Mo metal powder with a grain size of 3.9 µm. In a rubber tube closed at one end, with a diameter of 420 mm, a steel mandrel with a diameter of 141 mm was positioned in the centre. The molybdenum metal powder was filled into the intermediate space between the steel core and the rubber wall.

This was followed by closing the rubber tube at its open end by means of a rubber cap. The closed rubber tube was positioned in a cold-isostatic press, and compacted at a pressure of 210 MPa.

The green compact had a density of 64% of the theoretical density. The outer diameter was approximately 300 mm. The green compact produced in this way was sintered in an indirect sintering furnace at a temperature of 1900° C. The sintered density was 94.9% of the theoretical density.

After the sintering operation, the tube blank was machined on all sides, the outer diameter being 243 mm, the inner diameter 123 mm and the length 1060 mm. The extrusion took place on a 2500 t indirect extrusion press. The tube blank was heated to a temperature of 1100° C. in a gas-heated rotary hearth kiln. The lambda value was in this case set such that the atmosphere was slightly reducing, whereby oxidation of the molybdenum was prevented. After the initial heating in the rotary kiln, the extruded blank was inductively heated to a temperature of 1250° C. and rolled in a loose fill of glass powder, so that glass powder adhered to the outside on all sides.

This was followed by pressing over a mandrel, whereby an extruded tube with a length of 2700 mm, an outer diameter of 170 mm and inner diameter of 129 mm was obtained.

A supporting tube, also referred to as a backing tube, of an austenitic steel with a wall thickness of 6 mm was positioned in the extruded tube. This assembly was straightened over a mandrel on a three-jaw forging machine at a temperature of 500° C. and slightly deformed, whereby a bond between the molybdenum tube and the supporting tube was produced.

The invention claimed is:

1. A tubular target, comprising:
   a molybdenum tube formed of a metal powder of Mo or Mo alloy, said molybdenum tube having:
   an oxygen content less than 50 μg/g;
   a density greater than 99% of a theoretical density;
   an average grain size transversely to an axial direction of the tube of less than 100 μm; and
   said molybdenum tube having ends and a wall thickness increasing towards said ends of said tube and said molybdenum tube having the characteristics of an extruded and subsequently forged tube.

2. The tubular target according to claim 1, which further comprises a supporting tube formed of a material selected from the group consisting of titanium, a titanium alloy, austenitic steel, or a copper alloy disposed inside said molybdenum tube.

3. The tubular target according to claim 2, wherein said supporting tube is connected to said molybdenum tube by way of a material bond or a form-fitting connection.

4. The tubular target according to claim 1, which further comprises a supporting tube of titanium or a titanium alloy connected to said molybdenum tube by way of a material bond.

5. The tubular target according to claim 1, wherein a contact surface between said molybdenum tube and said supporting tube amounts to at least 30% of a theoretically possible surface area.

6. The tubular target according to claim 1, wherein said molybdenum tube has an oxygen content of less than 20 μg/g.

7. The tubular target according to claim 1, wherein said molybdenum tube has a density greater than 99.8% of the theoretical density.

8. The tubular target according to claim 1, wherein said molybdenum tube has an average grain size transversely to the axial direction less than 50 μm.

9. The tubular target according to claim 1, wherein said molybdenum tube consists of pure molybdenum with a metallic purity, exclusive of tungsten, of greater than 99.99% by weight.

10. The tubular target according to claim 1, wherein said molybdenum tube consists of a molybdenum alloy containing 0.5 to 30% by weight of at least one of V, Nb, Ta, Cr, and W.

11. The tubular target according to claim 1, wherein said molybdenum tube has a recovered or recrystallized material structure.

12. A deposition process, which comprises:
    providing a tubular target according to claim 1 and installing the tubular target in a sputtering deposition system; and
    sputtering the tubular target to deposit a molybdenum or molybdenum alloy layer of an LCD-TFT flat screen.

13. A deposition process, which comprises:
    providing a tubular target according to claim 1 and installing the tubular target in a deposition system; and
    sputtering the tubular target to deposit molybdenum or molybdenum alloy on glass to form a coated glass.

* * * * *